United States Patent
Ono et al.

(10) Patent No.: US 9,578,754 B2
(45) Date of Patent: Feb. 21, 2017

(54) METAL BASE SUBSTRATE, POWER MODULE, AND METHOD FOR MANUFACTURING METAL BASE SUBSTRATE

(71) Applicant: Mitsubishi Electric Corporation, Tokyo (JP)

(72) Inventors: Mariko Ono, Fukuoka (JP); Akira Goto, Fukuoka (JP); Rei Yoneyama, Tokyo (JP); Takami Otsuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/615,006

(22) Filed: Feb. 5, 2015

(65) Prior Publication Data
US 2015/0332982 A1    Nov. 19, 2015

(30) Foreign Application Priority Data
May 19, 2014    (JP) .................................. 2014-102969

(51) Int. Cl.
*H01L 21/00* (2006.01)
*H05K 3/44* (2006.01)
(Continued)

(52) U.S. Cl.
CPC ............. *H05K 3/44* (2013.01); *H01L 21/4828* (2013.01); *H01L 21/4842* (2013.01); *H01L 23/043* (2013.01); *H01L 23/053* (2013.01); *H01L 23/14* (2013.01); *H01L 23/24* (2013.01); *H01L 23/296* (2013.01); *H01L 23/3107* (2013.01); *H01L 23/3735* (2013.01); *H01L 23/48* (2013.01); *H01L 23/49534* (2013.01); *H01L 23/49541* (2013.01); *H01L 23/49582* (2013.01); *H01L 23/49586* (2013.01); *H01L 24/40* (2013.01); *H01L 24/49* (2013.01); *H05K 1/0326* (2013.01); *H05K 1/056* (2013.01); *H05K 1/09* (2013.01); *H05K 3/38* (2013.01); *H01L 23/3736* (2013.01); *H01L 23/49861* (2013.01); *H01L 24/32* (2013.01); *H01L 24/48* (2013.01); *H01L 2224/291* (2013.01); *H01L 2224/32225* (2013.01); *H01L 2224/40095* (2013.01); *H01L 2224/40225* (2013.01); *H01L 2224/48091* (2013.01); *H01L 2224/48137* (2013.01); *H01L 2224/48177* (2013.01);
(Continued)

(58) Field of Classification Search
CPC ........................................................ H05K 7/02
See application file for complete search history.

(56) References Cited

U.S. PATENT DOCUMENTS

| | | | | |
|---|---|---|---|---|
| 5,920,119 A | * | 7/1999 | Tamba | H01L 25/072 257/678 |
| 2013/0270684 A1 | * | 10/2013 | Negishi | H01L 21/565 257/675 |
| 2014/0147695 A1 | * | 5/2014 | Sunachi | H01L 23/3735 428/612 |

FOREIGN PATENT DOCUMENTS

| | | |
|---|---|---|
| JP | H06-350213 A | 12/1994 |
| JP | 2009-231716 A | 10/2009 |
| JP | 2010-199505 A | 9/2010 |

* cited by examiner

*Primary Examiner* — William Harriston
(74) *Attorney, Agent, or Firm* — Studebaker & Brackett PC (57) ABSTRACT

A metal base substrate of the present invention includes a copper plate made of copper, a metal layer that is formed on the copper plate and is made of a metal different from the copper, an insulating resin sheet that is formed by bonding (Continued)

a sheet made of an insulating resin onto the metal layer, and a circuit pattern formed on the insulating resin sheet.

20 Claims, 4 Drawing Sheets

(51) Int. Cl.
| | |
|---|---|
| H01L 23/043 | (2006.01) |
| H05K 3/38 | (2006.01) |
| H01L 23/495 | (2006.01) |
| H01L 23/31 | (2006.01) |
| H01L 23/29 | (2006.01) |
| H01L 23/00 | (2006.01) |
| H01L 21/48 | (2006.01) |
| H05K 1/05 | (2006.01) |
| H05K 1/09 | (2006.01) |
| H05K 1/03 | (2006.01) |
| H01L 23/14 | (2006.01) |
| H01L 23/373 | (2006.01) |
| H01L 23/48 | (2006.01) |
| H01L 23/053 | (2006.01) |
| H01L 23/24 | (2006.01) |
| H01L 23/498 | (2006.01) |

(52) U.S. Cl.
CPC ........... *H01L 2224/48227* (2013.01); *H01L 2224/73265* (2013.01); *H01L 2924/0665* (2013.01); *H01L 2924/1033* (2013.01); *H01L 2924/10253* (2013.01); *H01L 2924/10272* (2013.01); *H01L 2924/17724* (2013.01); *H01L 2924/17747* (2013.01); *H01L 2924/181* (2013.01); *H01L 2924/19107* (2013.01); *H05K 3/381* (2013.01); *H05K 3/383* (2013.01); *H05K 2201/066* (2013.01); *H05K 2203/06* (2013.01)

METAL BASE SUBSTRATE, POWER MODULE, AND METHOD FOR MANUFACTURING METAL BASE SUBSTRATE

BACKGROUND OF THE INVENTION

Field of the Invention

The present invention relates to a metal base substrate for a semiconductor device, a power module including the metal base substrate, and a method for manufacturing the metal base substrate.

Description of the Background Art

In the field of power electronics or the like, a metal substrate having a semiconductor chip mounted thereon is conventionally used to secure heat dissipation properties for heat generated in the semiconductor chip while being electrically insulated from the semiconductor chip, for example.

For example, in a case where a copper plate is used as a metal substrate, aluminum (or aluminum alloy) is rolled on one side (surface on the side on which an insulating layer is formed) of the copper plate to form a cladding base plate, in order to improve adhesion properties (adhesion strength) between the copper plate and the insulating layer formed on the copper plate. A liquid epoxy resin is applied on the cladding base plate to form the insulating layer, to thereby obtain a metal base substrate. The metal base substrate is disclosed (for example, see Japanese Patent Application Laid-Open No. 6-350213 (1994)).

In Japanese Patent Application Laid-Open No. 6-350213 (1994), the liquid epoxy resin is applied on the copper plate to form the insulating layer, so that the insulating layer fails to secure a thickness thereof and fails to maintain a withstand voltage. Moreover, a pinhole is formed in the insulating layer formed by the application of the liquid epoxy resin, whereby the withstand voltage may possibly decrease. Furthermore, the problem arises that a manufacturing process in manufacturing the configuration mentioned above becomes complicated.

SUMMARY OF THE INVENTION

The present invention has been made in view of the above-mentioned problems, and an object thereof is to provide a metal base substrate that can suppress a decrease in withstand voltage and can easily be manufactured, a power module, and a method for manufacturing the metal base substrate.

A metal base substrate includes a substrate made of copper, a first metal layer that is formed on the substrate and is made of a metal different from the copper, an insulating resin sheet that is formed by bonding a sheet made of an insulating resin onto the first metal layer, and a circuit pattern formed on the insulating resin sheet.

In the present invention, the metal base substrate includes the substrate made of copper, the first metal layer that is formed on the substrate and is made of the metal different from the copper, the insulating resin sheet that is formed by bonding the sheet made of the insulating resin onto the first metal layer, and the circuit pattern formed on the insulating resin sheet. Thus, the metal base substrate can suppress a decrease in withstand voltage and can easily be manufactured.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will be described below with reference to the drawings.

First Preferred Embodiment

First, a configuration of a metal base substrate according to a first preferred embodiment of the present invention will be described.

Figure 1:
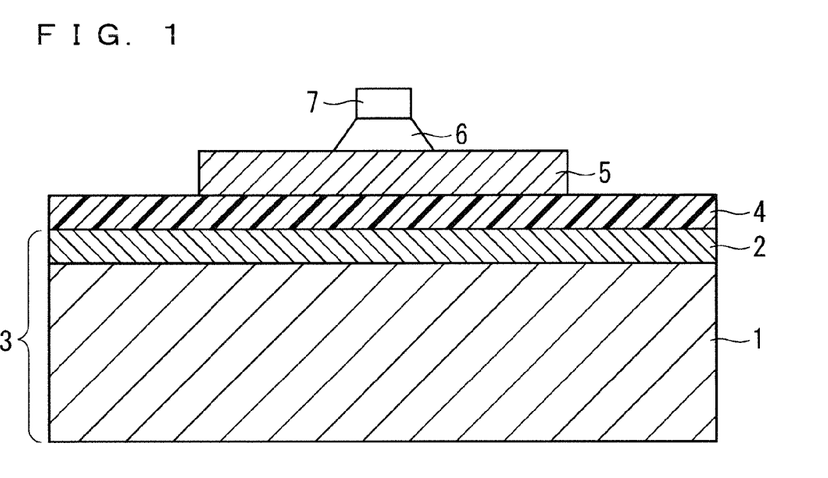
FIG. 1 is a diagram showing an example of a configuration of a metal base substrate according to a first preferred embodiment of the present invention.

FIG. 1 is a diagram showing an example of the configuration of the metal base substrate according to the first preferred embodiment.

As shown in FIG. 1, a metal layer 2 (first metal layer) is bonded onto a copper plate 1 (substrate made of copper), and the copper plate 1 and the metal layer 2 form a cladding base plate 3. Here, the metal layer 2 may be made of, for example, aluminum or an aluminum alloy that is a kind of metal different from copper and a metal having good adhesion properties to an insulating resin sheet 4 described later.

The insulating resin sheet 4 that is formed by bonding a sheet made of an insulating resin onto the metal layer 2. The insulating resin sheet 4 is made of an epoxy resin, for example. Here, the insulating resin sheet 4 may be individually bonded to the metal layer 2 and may also be bonded to the metal layer 2 through an adhesive. A circuit pattern 5 is formed on the insulating resin sheet 4.

A semiconductor chip 7 is mounted on the circuit pattern 5 through a solder 6.

Next, a method for manufacturing the metal base substrate will be described.

First, the metal layer 2 is bonded onto the copper plate 1. Next, the insulating resin sheet 4 is bonded onto the metal layer 2. Then, the circuit pattern 5 is formed on the insulating resin sheet 4 to obtain the metal base substrate. Subsequently, the semiconductor chip 7 is mounted on an arbitrary portion of the circuit pattern 5 in the metal base substrate through a conductive bonding material such as the solder 6.

As described above, the insulating resin sheet 4 is used to easily secure a thickness of the insulating resin sheet 4, whereby formation of pinholes can also be prevented. Therefore, a decrease in withstand voltage can be suppressed, and an insulation failure can be prevented. Moreover, the metal base substrate can be easily manufactured.

Next, modifications (first to third modifications) of configurations of the metal base substrate will be described.

First Modification

Figure 2:
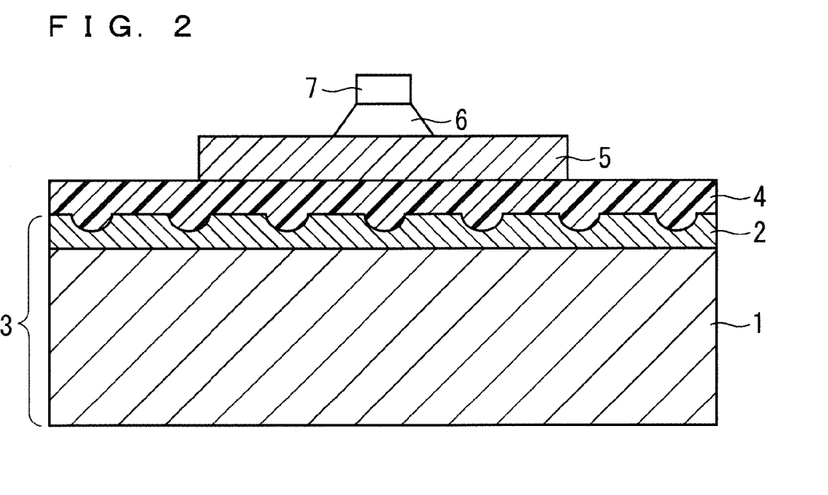
FIGS. 2 to 4 are diagrams showing the other examples of the configuration of the metal base substrate according to the first preferred embodiment of the present invention.

FIG. 2 is a diagram showing the other example of the configuration of the metal base substrate.

As shown in FIG. 2, the metal base substrate according to the first modification is characterized in that a surface (front surface) on the insulating resin sheet 4 side of the metal layer 2 is roughened. The other configuration is similar to that in FIG. 1, so that descriptions will be omitted here.

After the metal layer 2 is formed, the front surface of the metal layer 2 is roughened. As a method for roughening the front surface of the metal layer 2, the front surface thereof (surface on the side on which the insulating resin sheet 4 is to be formed) is physically polished with an abrasive or etched to be roughened subsequent to the formation of the metal layer 2 on the copper plate 1.

The insulating resin sheet 4 is bonded onto the roughened surface of the metal layer 2. Here, the insulating resin sheet 4 is softened by, for example, heat or the application of pressure, to thereby closely adhere to the irregularities of the roughened surface of the metal layer 2.

As described above, the front surface of the metal layer 2 is roughened, whereby the adhesion properties between the metal layer 2 and the insulating resin sheet 4 can be further improved.

Second Modification

Figure 3:
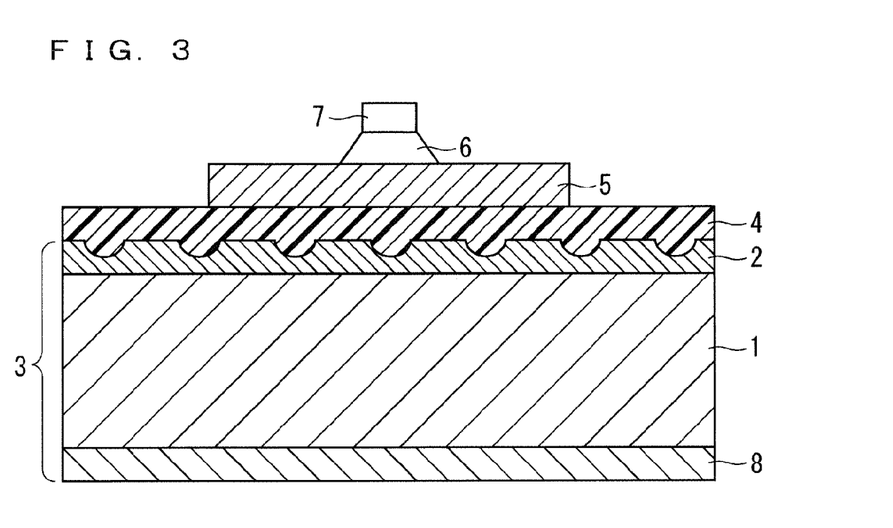

FIG. 3 is a diagram showing the other example of the configuration of the metal base substrate.

As shown in FIG. 3, the metal base substrate according to the second modification is characterized in that the copper plate 1 includes a metal layer 8 (second metal layer) formed on a back surface thereof (surface opposite to the metal layer 2). The other configuration is similar to that in FIG. 2, so that descriptions will be omitted here.

The metal layer 8 is formed of the same metal as that of the metal layer 2. In other words, the metal layer 2 and the metal layer 8 that are formed of the same kind of metal are each bonded to both sides (front surface and back surface) of the copper plate 1. Moreover, the copper plate 1, the metal layer 2, and the metal layer 8 form the cladding base plate 3.

As described above, the metal layer 2 and the metal layer 8 that are formed of the same kind of metal are formed on both the sides of the copper plate 1, whereby a warp in the copper plate 1 caused by a change in temperature can be suppressed.

In addition, FIG. 3 shows the case where the front surface of the metal layer 2 is roughened as an example, but even if the front surface of the metal layer 2 is not roughened, effects similar to those above can be obtained. In other words, the metal layer 8 may be formed on the back surface of the copper plate 1 (surface opposite to the metal layer 2) in the metal base substrate as shown in FIG. 1.

Third Modification

Figure 4:
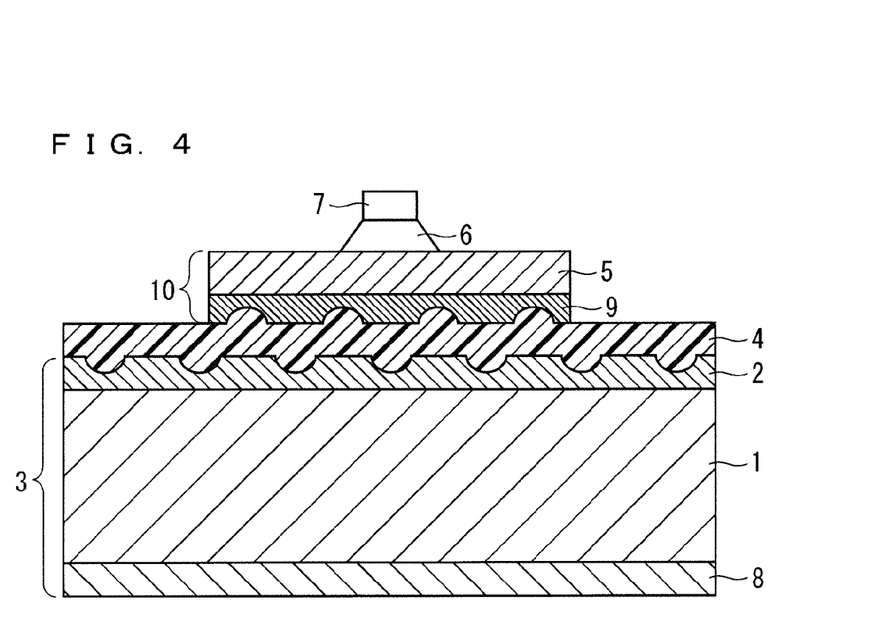

FIG. 4 is a diagram showing the other example of the configuration of the metal base substrate.

As shown in FIG. 4, the metal base substrate according to the third modification is characterized in that a metal layer 9 (third metal layer) is provided between the insulating resin sheet 4 and the circuit pattern 5. The other configuration is similar to that in FIG. 3, so that descriptions will be omitted here.

The circuit pattern 5 is made of a conductive material such as copper. Moreover, the metal layer 9 is formed of the same metal as that of the metal layer 2 (also formed of the same metal as that of the metal layer 8 in the example of FIG. 4), and the metal layer 9 has a surface roughened on the insulating resin sheet 4 side.

The circuit pattern 5 and the metal layer 9 are bonded to form a cladding circuit pattern 10. Moreover, the roughened surface of the metal layer 9 and the insulating resin sheet 4 are bonded.

As described above, the adhesion properties between the circuit pattern 5 and the insulating resin sheet 4 are improved, whereby the circuit pattern 5 is hardly peeled off even if the thickness of the circuit pattern 5 is made thick. Therefore, the metal base substrate having high heat conductivity can be obtained.

In addition, FIG. 4 shows the case where the front surface of the metal layer 2 is roughened and the metal layer 8 is formed on the back surface of the copper plate 1 as an example, but effects similar to those above can be obtained without roughening the front surface of the metal layer 2 or forming the metal layer 8. In other words, the metal layer 9 may be formed on the circuit pattern 5 on the insulating resin sheet 4 side in each of the metal base substrates shown in FIGS. 1 and 2.

FIG. 4 shows the case where the front surface of the metal layer 9 is roughened, and if the desirable adhesion properties can be obtained, the front surface of the metal layer 9 may not be roughened.

Second Preferred Embodiment

Figure 5:
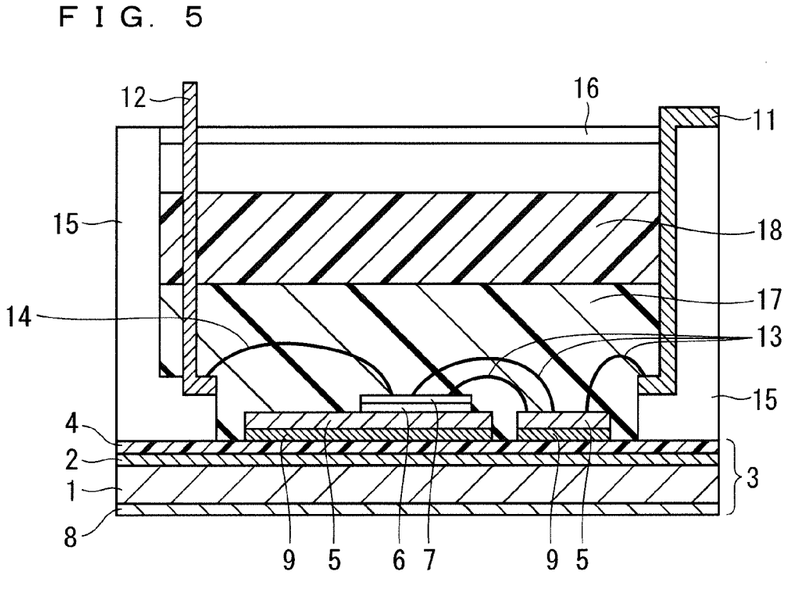
FIG. 5 is a diagram showing an example of a configuration of a power module according to a second preferred embodiment of the present invention.

FIG. 5 is a diagram showing an example of a configuration of a power module according to a second preferred embodiment of the present invention.

As shown in FIG. 5, the power module includes the metal base substrate according to the first preferred embodiment, a case 15 having the metal base substrate as a lower surface, a power terminal 11 and a signal terminal 12 having one ends electrically connected to the semiconductor chip 7 mounted on the circuit pattern 5 of the metal base substrate, and a resin (resins 17 and 18) that fills the case 15 so as to expose at least the other ends of the power terminal 11 and the signal terminal 12.

In addition, the metal base substrate shown in FIG. 5 shows the case where the metal layer 8 as shown in FIG. 3 is formed on the back surface of the copper plate 1 in the metal base substrate shown in FIG. 1 as an example, but it suffices that the metal base substrate shown in FIG. 5 is as long as the metal base substrate according to the first preferred embodiment. A lid 16 may be provided separately from the case 15 and may also be provided integrally with the case 15.

The power terminal 11 and the signal terminal 12 are provided to supply the semiconductor chip 7 with power or a signal from the outside. The power terminal 11 and the semiconductor chip 7 are electrically connected through power wires 13 and the circuit pattern 5. The signal terminal 12 and the semiconductor chip 7 are electrically connected through a signal wire 14.

The resin 17 fills the case 15 so as to expose the other ends of the power terminal 11 and the signal terminal 12 and to seal the semiconductor chip 7, the power wires 13, and the signal wire 14. Here, the resin 17 is a gel resin and may be a gel silicone resin, for example.

As described above, the metal base substrate according to the first preferred embodiment can be applied to the power module in which a change in shape occurs due to a change in temperature. Particularly in a case where the resin being the filling material is a gel, the resin fails to fix the structural components that are objects to be sealed because the resin is soft (has flexibility), resulting in the problem in the past that a circuit pattern or an insulating layer are easily peeled off from a cladding base plate. However, using the metal base substrate according to the first preferred embodiment of the present invention can prevent the circuit pattern 5 or the insulating resin sheet 4 from being peeled off from the cladding base plate 3 because the adhesion properties among the circuit pattern 5, the insulating resin sheet 4, and the cladding base plate 3 are improved.

Next, modifications (modifications 1 to 5) of configurations of the power module will be described.

First Modification

Figure 6:
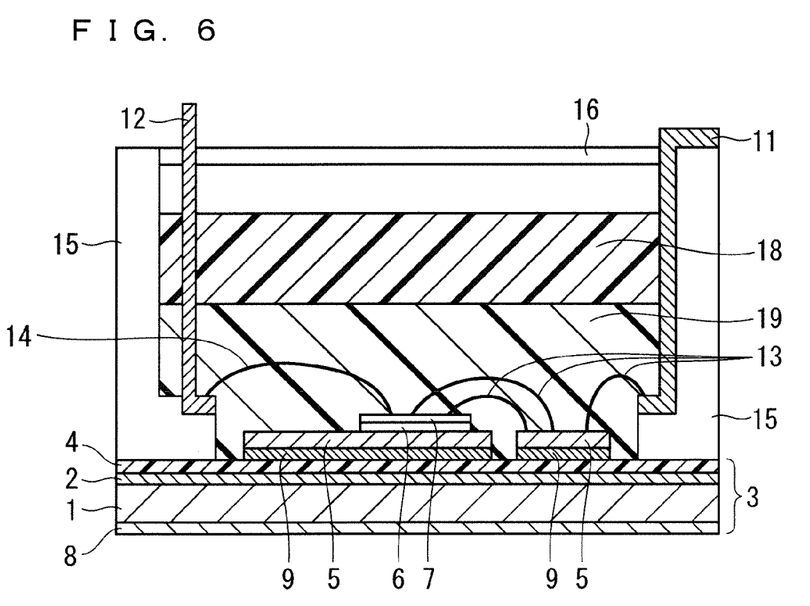
FIGS. 6 to 8 are diagrams showing the other examples of the configuration of the power module according to the second preferred embodiment of the present invention.

FIG. 6 is a diagram showing the other example of the configuration of the power module.

As shown in FIG. 6, the power module according to the first preferred modification is characterized in that a resin 19 is a solid resin. The other configuration is similar to that in FIG. 5, so that descriptions will be omitted here.

The resin 19 is the solid resin and may be a solid epoxy resin, for example. A method for filling the case 15 with the resin 19 may be potting, for example.

As described above, the metal base substrate according to the first preferred embodiment can be applied to the power module in which a change in shape occurs due to a change in temperature. Particularly in a case where the resin being the filling material is solid, the resin can fix the structural components that are objects to be sealed, but stress is caused by each of different thermal expansion coefficients of a circuit pattern, an insulating layer, and a cladding base plate, resulting in the problem in the past that the circuit pattern or the insulating layer are easily peeled off from the cladding base plate. However, using the metal base substrate according to the first preferred embodiment of the present invention can prevent the circuit pattern 5 or the insulating resin sheet 4 from being peeled off from the cladding base plate 3 and can improve reliability (life) of the power module because the adhesion properties among the circuit pattern 5, the insulating resin sheet 4, and the cladding base plate 3 are increased.

Second Modification

Figure 7:
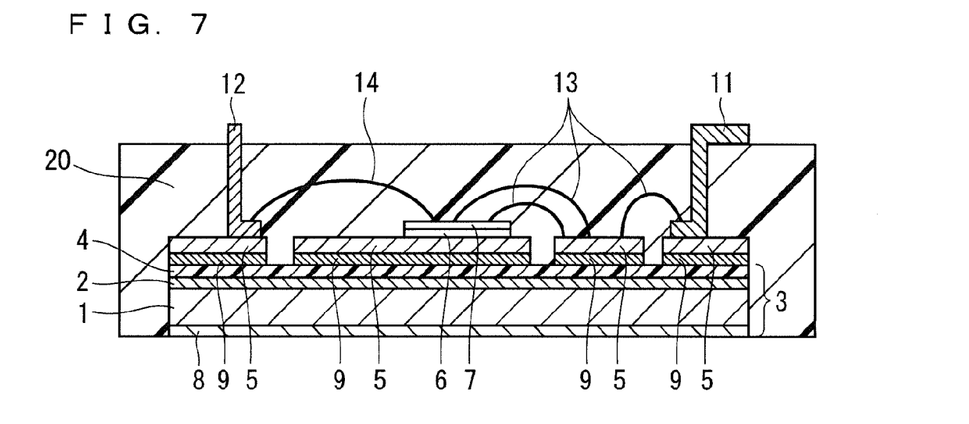

FIG. 7 is a diagram showing the other example of the configuration of the power module.

As shown in FIG. 7, the power module according to the second modification includes the metal base substrate according to the first preferred embodiment, the power terminal 11 and the signal terminal 12 having the one ends electrically connected to the semiconductor chip 7 mounted on the circuit pattern 5 of the metal base substrate, and a sealing resin 20 that seals the metal base substrate, the semiconductor chip 7, the power terminal 11, and the signal terminal 12 so as to expose at least the other ends of the power terminal 11 and the signal terminal 12.

In addition, the metal base substrate shown in FIG. 7 shows the case where the metal layer 8 as shown in FIG. 3 is formed on the back surface of the copper plate 1 in the metal base substrate shown in FIG. 1 as an example, but it suffices that the metal base substrate shown in FIG. 7 is as long as the metal base substrate according to the first preferred embodiment.

The power terminal 11 and the signal terminal 12 are provided to supply the semiconductor chip 7 with power or the signal from the outside. The power terminal 11 and the semiconductor chip 7 are electrically connected through power wires 13 and the circuit pattern 5. The signal terminal 12 and the semiconductor chip 7 are electrically connected through the signal wire 14.

The sealing resin 20 seals the metal base substrate, the semiconductor chip 7, the power terminal 11, and the signal terminal 12 so as to expose the other ends of the power terminal 11 and the signal terminal 12 and the back surface side (surface of the metal layer 8 opposite to the copper plate 1) of the metal base substrate. The sealing resin 20 is the solid resin and may be a solid epoxy resin, for example. A method for sealing with the sealing resin 20 may be a method for sealing by transfer molding, for example.

As described above, the metal base substrate according to the first preferred embodiment can be applied to the power module in which a change in shape occurs due to a change in temperature. Particularly in a case where the resin being the filling material is solid, the resin can fix the structural components that are objects to be sealed, but stress is caused by each of different thermal expansion coefficients of a circuit pattern, an insulating layer, and a cladding base plate, resulting in the problem in the past that the circuit pattern or the insulating layer are easily peeled off from the cladding base plate. However, using the metal base substrate according to the first preferred embodiment of the present invention can prevent the circuit pattern 5 or the insulating resin sheet 4 from being peeled off from the cladding base plate 3 and can improve reliability (life) of the power module because the adhesion properties among the circuit pattern 5, the insulating resin sheet 4, and the cladding base plate 3 are increased.

Third Modification

A third modification is characterized in that connection of the power wires 13 to the semiconductor chip 7 is performed by wire bonding in the power modules shown in FIGS. 5 to 7. In other words, the semiconductor chip 7 and the power terminal 11 are connected with the wires formed by wire bonding.

In the metal base substrate used in the power modules shown in FIGS. 5 to 7, the adhesion properties between the circuit pattern 5 and the insulating resin sheet 4 are improved. Therefore, the wire bonding can be performed with force stronger than that in the conventional manner.

As described above, the wire bonding can be performed with force stronger than that in the conventional manner, so that bonding portions of the power wires 13 connected by wire bonding have a longer life, and reliability (life) of the power module can thus be improved.

In addition, FIGS. 5 to 7 show the example of the connection of the power wires 13 to the semiconductor chip 7, and even in a case where the connection of the power wires 13 to the circuit pattern 5 is performed by wire bonding, similar effects can be obtained.

Fourth Modification

Figure 8:
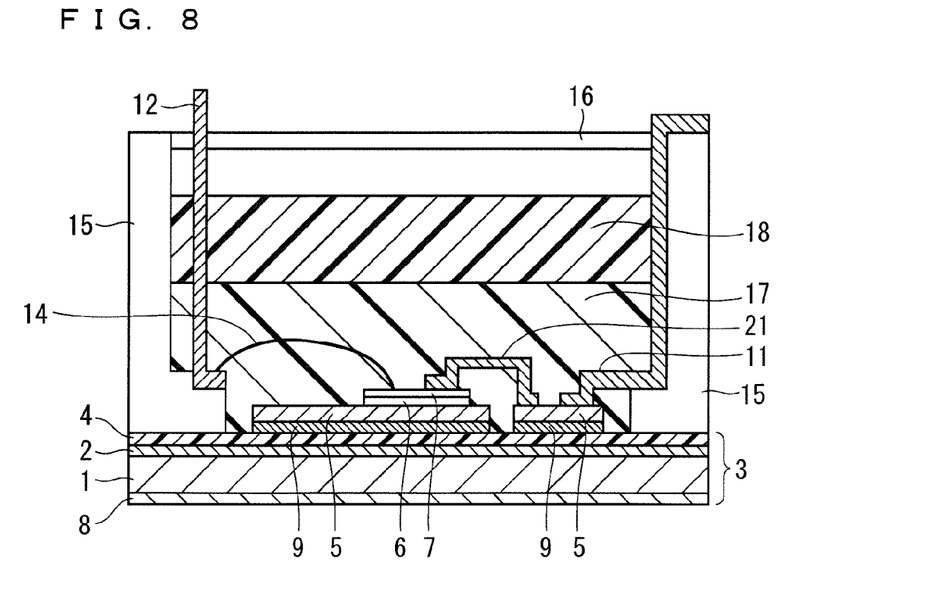

FIG. 8 is a diagram showing the other example of the configuration of the power module.

As shown in FIG. 8, the power module according to the fourth preferred embodiment is characterized in that an electrode terminal 21 having a plate shape is used instead of the power wires 13 having a linear shape in the power module shown in FIG. 5. In other words, the semiconductor chip 7 and the power terminal 11 are connected with the electrode terminal 21 different from the power terminal 11.

The other configuration is similar to that in FIG. 5, so that descriptions will be omitted here.

A method for bonding the electrode terminal 21 to the semiconductor chip 7 may be a means of soldering, ultrasonic (US) bonding, or welding, for example.

When an electrode terminal is bonded to a semiconductor chip, a power module is thermally deformed and the electrode terminal thus applies a tensile stress, resulting in the problem in the past that a bonding portion between an insulating layer and a circuit pattern is peeled off because the adhesion properties between the insulating layer and the circuit pattern are weak. However, in the fourth modification, the adhesion properties between the insulating resin sheet 4 and the circuit pattern 5 are improved, the bonding portion between the insulating resin sheet 4 and the circuit pattern 5 can be prevented from being peeled off even if the electrode terminal 21 is bonded to the semiconductor chip 7.

In addition, FIG. 8 shows the case where the power wires 13 shown in FIG. 5 are substituted by the electrode terminal 21, and similar effects can also be obtained even in a case where the power wires 13 shown in FIGS. 6 and 7 are substituted by the electrode terminal 21.

Moreover, FIG. 8 shows the example of the connection of the electrode terminal 21 to the semiconductor chip 7, and similar effects can also be obtained even in a case where the electrode terminal 21 is bonded to the circuit pattern 5.

Fifth Modification

In the fifth modification, the semiconductor chip 7 in the power modules shown in FIGS. 5 to 8 is characterized in that the semiconductor chip 7 includes Si or a high temperature semiconductor device (semiconductor device capable of operating in high temperature), such as SiC and GaN.

A case where the high temperature semiconductor device such as the SiC and the GaN is used as a semiconductor chip for a wide swing width in a temperature cycle or under a high temperature environment requires more suppression of warpage caused by a thermal stress and requires more resistance to peeling or cracking than a package configuration of a power module using the conventional Si as a semiconductor chip. In this case, the power modules shown in FIGS. 5 to 7 can increase the life of reliability (especially a temperature cycle life).

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A metal base substrate, comprising:
   a substrate made of copper;
   a first metal layer that is formed on said substrate and is made of a metal different from said copper;
   an insulating resin sheet that is formed by bonding a sheet made of an insulating resin onto said first metal layer; and
   a circuit pattern formed on said insulating resin sheet, wherein
   said circuit pattern is made of copper,
   the metal base substrate further comprising a third metal layer made of the same metal as said metal between said insulating resin sheet and said circuit pattern.

2. The metal base substrate according to claim 1, wherein said first metal layer has a surface roughened on said insulating resin sheet side.

3. The metal base substrate according to claim 1, wherein said metal is aluminum or an aluminum alloy.

4. The metal base substrate according to claim 1, wherein said insulating resin sheet is made of an epoxy resin.

5. A power module, comprising:
   the metal base substrate according to claim 1;
   a case having said metal base substrate as a lower surface;
   a terminal having one end electrically connected to a semiconductor chip mounted on said circuit pattern of said metal base substrate; and
   a resin that fills said case so as to expose at least the other end of said terminal.

6. The power module according to claim 5, wherein said resin includes a gel silicone resin.

7. The power module according to claim 5, wherein said resin includes a solid epoxy resin.

8. The power module according to claim 5, wherein said semiconductor chip and said terminal are connected with a wire formed by wire bonding.

9. The power module according to claim 5, wherein said semiconductor chip and said terminal are connected with a terminal different from said terminal.

10. The power module according to claim 5, wherein said semiconductor chip is any of Si, SiC, and GaN.

11. A power module, comprising:
    the metal base substrate according to claim 1;
    a terminal having one end electrically connected to a semiconductor chip mounted on said circuit pattern of said metal base substrate; and
    a sealing resin that seals said metal base substrate, said semiconductor chip, and said terminal so as to expose at least the other end of said terminal.

12. The power module according to claim 11, wherein said sealing resin includes an epoxy resin.

13. The power module according to claim 11, wherein said semiconductor chip and said terminal are connected with a wire formed by wire bonding.

14. The power module according to claim 11, wherein said semiconductor chip and said terminal are connected with a terminal different from said terminal.

15. The power module according to claim 11, wherein said semiconductor chip is any of Si, SiC, and GaN.

16. The metal base substrate according to claim 1, further comprising
    a second metal layer that is formed on a surface of said substrate opposite to said first metal layer and is made of the same metal as said metal.

17. A method for manufacturing a metal base substrate, comprising the steps of:
    (a) preparing a substrate made of copper;
    (b) forming a first metal layer made of a metal different from said copper on said substrate;
    (c) providing a sheet made of a solid insulating resin and forming an insulating resin sheet by bonding the sheet made of the solid insulating resin onto said first metal layer; and
    (d) forming a circuit pattern on said insulating resin sheet.

18. The method for manufacturing a metal base substrate according to claim 17, wherein said step (b) includes the step of roughening a surface of said first metal layer on a side on which said insulating resin sheet is to be formed.

19. The method for manufacturing a metal base substrate according to claim 17, further comprising the step of (e)

forming a second metal layer made of the same metal as said metal on a surface of said substrate opposite to said first metal layer.

20. The method for manufacturing a metal base substrate according to claim 17, wherein said circuit pattern is made of copper in said step (d),
   the method further comprising the step of (f) forming a third metal layer made of the same metal as said metal on said insulating resin sheet between said step (c) and said step (d).

* * * * *